United States Patent
Razeghi

(10) Patent No.: US 6,610,553 B2
(45) Date of Patent: Aug. 26, 2003

(54) ALUMINUM-FREE VERTICAL CAVITY SURFACE EMITTING LASER (VCSELS)

(76) Inventor: Manijeh Razeghi, 1500 Sheridan Rd., Wilmette, IL (US) 60091

(*) Notice: Subject to any disclaimer, the term of this patent is extended or adjusted under 35 U.S.C. 154(b) by 32 days.

(21) Appl. No.: 10/154,876

(22) Filed: May 24, 2002

(65) Prior Publication Data

US 2002/0172254 A1 Nov. 21, 2002

Related U.S. Application Data

(62) Division of application No. 09/550,665, filed on Apr. 17, 2000, now Pat. No. 6,480,520.

(51) Int. Cl.[7] ............................................. H01L 21/00
(52) U.S. Cl. .............................. 438/22; 438/29; 438/46
(58) Field of Search ........................... 438/22, 29, 36, 438/34, 37, 39, 46, 47

(56) References Cited

U.S. PATENT DOCUMENTS 5,018,157 A      5/1991  Deppe et al.
6,008,067 A  *  12/1999  Ramdani et al. ............... 438/46
6,121,068 A  *   9/2000  Ramdani et al. ............... 438/39

* cited by examiner

*Primary Examiner*—Tuan H. Nguyen

(57) ABSTRACT

An Al-free VCSEL is grown by MOCVD procedure by growing GaInP/GaAs as a conventional distributed Bragg reflector (DBR) 36 or less periods are then formed as the active layer. The DBRs are composed of repeating layers of a 69 nm period of GaAs and a 76 nm period of InGaP to form a superlattice as quarter wave thickness stacks. After the lower layer of n-type DBR is deposited by MOCVD, a lift-off procedure opens up windows in an evaporated layer of $SiO_2$. The active region and upper p-type DBR is then deposited by MOCVD.

7 Claims, 3 Drawing Sheets

The measured (solid line) and calculated (dashed line) reflectivity of the 36 period GaInP/GaAs DBR.

Fig. 1. The measured (solid line) and calculated (dashed line) reflectivity of the 36 period GaInP/GaAs DBR.

Fig. 2. The high resolution x-ray diffraction (top) and simulation (bottom) spectra of the 36 period GaInP/GaAs DBR.

ALUMINUM-FREE VERTICAL CAVITY SURFACE EMITTING LASER (VCSELS)

This application is a divisional of U.S. patent application Ser. No. 09/550,665 on Apr. 17, 2000, now U.S. Pat. No. 4,480,520.

FIELD OF THE INVENTION

This invention relates to semiconductor III-V alloy compounds, and more specifically to DBR VCSELs.

BACKGROUND OF THE INVENTION

The importance of semiconductor emitters and detectors is rapidly increasing along with progress in the optoelectronic field, such as optical fiber communication, optical data processing, storage and solid state laser pumping.

VCSELs emitting at $\lambda=0.98$ $\mu$m are very attractive devices for optical communication systems and other applications because of their extremely low power requirement, high efficiency, circular beam output, and two dimensional scalability. Virtually every device reported to date contains Al in the AlGaAs distributed Bragg reflector (DBR) mirror stacks that serve as facets for the vertical optical cavity. However recently Al-free 808 nm and 980 nm laser diodes in edge-emitting lasers appear superior over those containing Al. Thus it would appear desirable to include an oxide-confined GaInAs/GaAs active region in a VCSEL through a simple selective regrowth step that will give an oxide-confined VCSELs without the use of Al.

Because they emit normal to the surface and are readily fabricated into two-dimensional arrays, vertical cavity surface emitting lasers (VCSELs) are ideally suited as light sources for optical fiber communication, digital printing and scanning, and optical disk storage. Other advantages VCSELs possess over edge-emitting lasers are ease of fabrication and testing, circular beam output, and low-bias, low-threshold operation.

Another major difference in a VCSEL is its microcavity structure. VCSELs range in size from as little as 1 $\mu$m up to 100 $\mu$m in diameter, much smaller than their edge-emitting counterparts, hence its output beam will be much smaller as well. How the optical cavity is defined is crucial to its performance. One early method used an air post where the as-grown structure was etched into cylindrical pillars, and the size of the pillar determined the lateral size of the cavity. Another method for the purpose of transverse carrier confinement is to ion implant the outlying area to force the carriers to flow though the active region. The lateral cavity size was determined by the window of the unimplaned area.

Unfortunately, these methods suffer from the problem of current spreading into the surrounding region, which raises the threshold current and degrades laser performance. Also, for air post structures sidewall nonradiative recombination is excessive, and for ion implanted structures, implantation damage is present. Both of these occurrences also degrade performance. However, recently a relatively new technique involving oxidation of the outlying area was introduced to laterally define the optical cavity and improved VCSEL performance.

It was well known that semiconductor materials containing Al, such as AlGaAs, are chemically unstable in a normal atmospheric environment and hydrolyze over time to form the stable native oxide $Al_xO_y$. This was always an unwanted effect and had serious consequences for the lifetimes of lasers containing Al. But there has been developed a controlled method to oxidize AlGaAs into $Al_xO_y$ at high temperatures with water vapor in an $N_2$ environment. This process of wet oxidation was then applied to transverse current confinement in VCSELs.

Superb results have been obtained from VCSELs with oxidized apertures, including record wall-plug efficiency and threshold current. However, the lifetime and reliability of these lasers is questionable since they do contain Al, which oxidize easily and degrade much more rapidly than Al-free lasers. This has already been demonstrated in edge-emitting lasers.

SUMMARY OF THE INVENTION

An object, therefore, of the invention is a Vertical Cavity Surface Emitting Laser for use in optical communication and other fields.

A further object of the subject invention is a Al-free VCSEL with InGaP/GaAs DBRs (Distributed Bragg Reflector).

A still further object of the subject invention is an oxide confined Al-free VCSEL.

These and other objects are attained by the subject invention wherein an Al-free VCSEL is grown by MOCVD procedure by growing GaInP/GaAs as a conventional distributed Bragg reflector (DBR). By the subject invention, 36 or less periods are formed as the active layer and achieve a reflectivity of 0.99, at 0.98 $\mu$m. The DBRs are composed of repeating layers of a 69 nm period of GaAs and a 76 nm period of InGaP to form a superlattice as quarter wave thickness stacks. The measured and calculated reflectivity is shown in FIG. 1; there is very good agreement between the two. The high resolution x-ray diffraction spectrum, pictured in FIG. 2, reveals over 25 orders of satellite peaks, indicating the excellent crystalline and interfacial quality of this structure. For localized epitaxy, after the lower layer of n-type DBR is deposited by MOCVD, a lift-off procedure opens up windows in an evaporated layer of $SiO_2$. The active region and upper p-type DBR is then deposited by MOCVD.

DETAILED DESCRIPTION OF THE INVENTION

Figure 1:
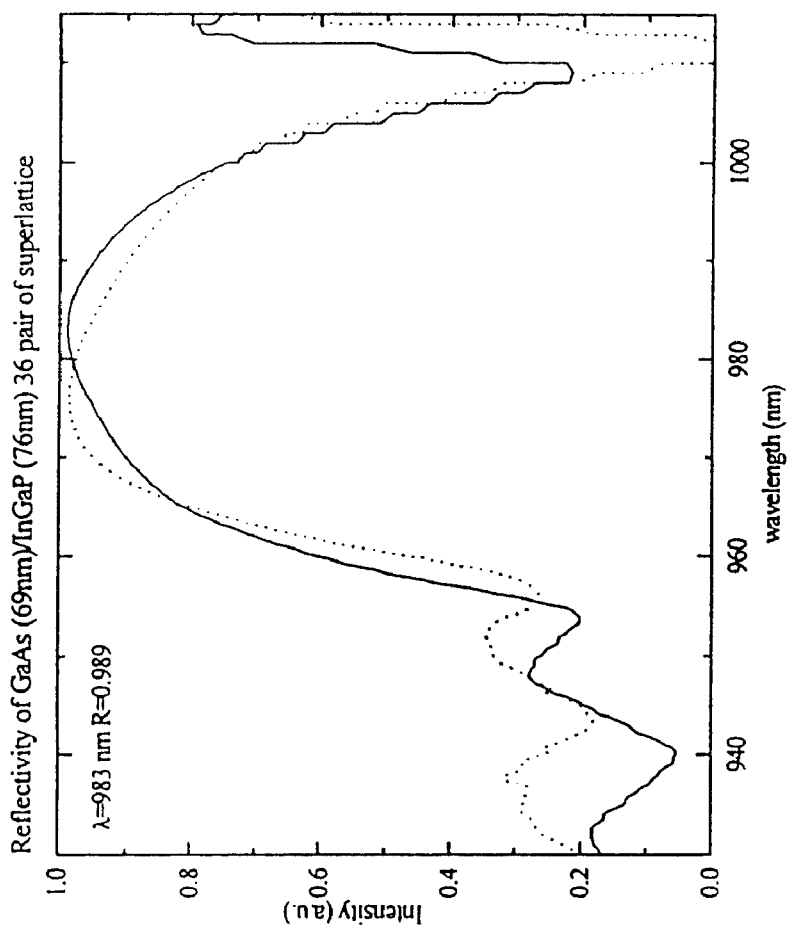
FIG. 1 is a graph showing x-ray diffraction of the DBR of the subject invention.
Figure 2:
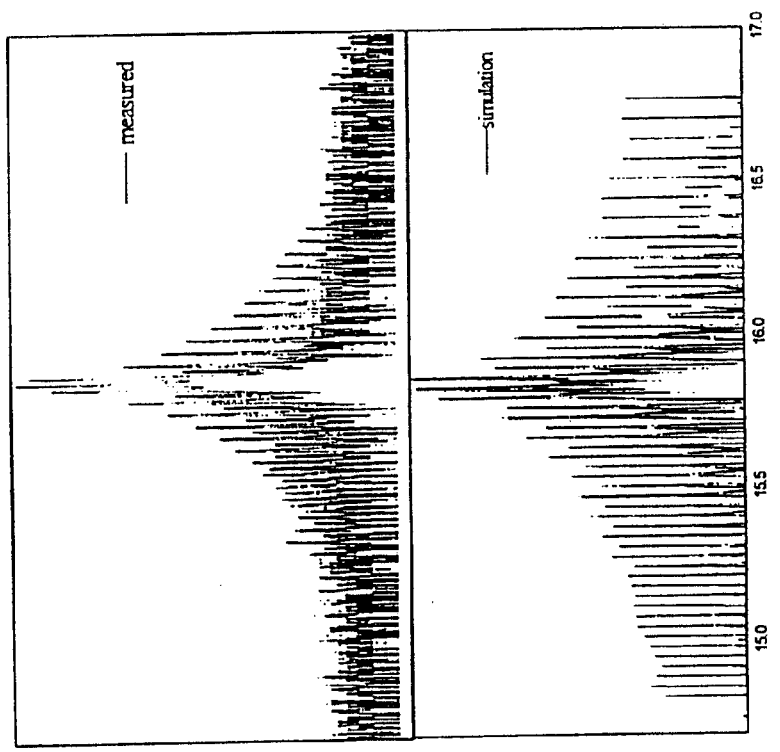
FIG. 2 is a spectra showing x-ray diffraction of the DBR of FIG. 1.

The reactor and associated gas-distribution scheme used herein are substantially as described in U.S. Pat. No. 5,384,151. The system comprises a cooled quartz reaction tube pumped by a high-capacity roughing pump (120 hr$^{-1}$) to a vacuum between 7 and 760 Torr. The substrate was mounted on a pyrolytically coated graphite susceptor that was heated by rf induction. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes. Flow rates were controlled by mass flow control.

The reactor was purged with a hydrogen flow of 4 liters min$^{-1}$, and the working pressure of 10–100 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure.

The precursors used in this study for the growth of GaInP and GaAs by LP-MOCVD are listed below.

| Group-III Sources | Group-V Source |
|---|---|
| $In(CH_3)_3$ | t-butylamine |
| $In(C_2H_5)_3$ | $NH_3$ |
| $(CH_3)_2In(C_2H_5)$ | $As(CH_3)$ |
| $Ga(CH_3)_3$ | $As(C_2H_5)$ |
| $Ga(C_2H_5)_3$ | $P(C_2H_5)_3$ |
| | $As(CH_3)_3$ |
| | $As(C_2H_5)_3$ |

An accurately metered flow of purified $H_2$ for TMIn and TEGa is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Pure and diluted Arsine ($AsH_3$) and Phosphine ($PH_3$) is used as a source of As and P. The metal alkyl or hydride flow can be either injected into the reactor or into the waste line by using two-way valves. In each case, the source flow is first switched into the waste line to establish the flow rate and then switched into the reactor. The total gas flow rate is about 4 liters $min^{-1}$ during growth. Stable flows are achieved by the use of mass flow controllers.

Dopants usable in the method of the subject invention are as follows:

| n dopant | p dopant |
|---|---|
| $H_2Se$ | $(CH_3)_2Zn$ |
| $H_2S$ | $(C_2H_5)_2Zn$ |
| $(CH_3)_3Sn$ | $(C_2H_5)_2Be$ |
| $(C_2H_5)_3Sn$ | $(CH_3)_2Cd$ |
| $SiH_4$ | $(\eta C_2H_5)_2Mg$ |
| $Si_2H_6$ | |
| $GeH_4$ | |

The substrate can be GaAs, Si, $Al_2O_3$, MgO, SiC, ZnO, $LiGaO_2$, $LiAlO_2$, $MgAl_2O_4$. The epitaxial layer quality is sensitive to the pretreatment of the substrate and the alloy composition. Pretreatment of the substrates prior to epitaxial growth was thus found to be beneficial. One such pretreatment procedure is as follows:

1. Dipping in $H_2SO_4$ for 3 minutes with ultrasonic agitation;
2. Rinsing in Deionized $H_2O$;
3. Rinsing in hot methanol;
4. Dipping in 3% Br in methanol at room temperature for 3 minutes (ultrasonic bath);
5. Rinsing in hot methanol;
6. Dipping in $H_2SO_4$ for 3 minutes;
7. Rinsing in deionized $H_2O$, and
8. Rinsing in hot methanol.

After this treatment, it is possible to preserve the substrate for one or two weeks without repeating this treatment prior to growth.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species, but is relatively independent of temperature between 460° and 650° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

The optimum growth conditions for the respective layers are listed in Table 1. The confinement of the active layer for the subject invention may be as a heterostructure, separate confinement heterostuctures, or with a quantum well.

TABLE 1

Optimum growth conditions.

| | GaAs | InGaP | InGaAs |
|---|---|---|---|
| Growth Pressure | 76 | 76 | 76 |
| Growth Temperature (° C.) | 480 | 480 | 480 |
| Total $H_2$ Flow (liter/min) | 4 | 4 | 4 |
| TMI (cc/min) | — | 75 | 12.5 |
| TEG (cc/min) | 96 | 76 | 90 |
| $AsH_3$ (cc/min) | 54 | — | 54 |
| $PH_3$ (cc/min) | — | 105 | — |
| Growth Rate (Å/min) | 150 | 260 | 160 |

For localized epitaxy, GaAs substrates were patterned with mesas of one of two sizes—16×16 $\mu$m or 400×400 $\mu$m—then depositing mismatched GaInP on top. The GaAs substrates, which have a surface normal of [001] with a 2 misorientation toward the [110] direction, were initially patterned with photoresist then selectively etched with electron cyclotron resonance enhanced reactive ion etching in a $BCl_3$/Ar environment to a depth of 1.5 $\mu$m. The remaining photoresist was removed and the surface was cleaned. The next step is the epitaxy, where 0.5 $\mu$m of GaInP with a mismatch of +0.30% was deposited. Successive layers of GaAs 69 nm and GaInP 76 nm are them deposited. A final p-type DBR of GaInP/GaAs is deposited, and doped with a p-type dopant, such as Mg.

A scanning electron microscopy (SEM) micrograph of the 16×16 $\mu$m mesas after etching but before regrowth shows both the surface and sidewalls are very smooth. After epitaxy of the GaInP, the mesa surface is shown to have maintained its smoothness, but the sidewalls are considerably rougher.

With the mismatch of the GaInP epilayer (+0.30%), many misfit dislocations are observed. On an ordinary planar substrate, these misfit dislocations would propagate unheeded until it reaches a free edge, namely, the edge of the substrate. However, it has been found that 60 misfit dislocations that nucleate on the mesa surface terminate at the mesa edge. This phenomenon overtly shows the advantage of growing on patterned substrates: nucleation sources that depend on surface area, such as threading dislocations and dislocation multiplication, and sharply reduced.

Better results are thus achieved with a smaller mesa size. However, misfit dislocations appear in the trenches between the mesas, and run unheeded since there is no barrier to stop them in the trenches. This should not affect the epilayers on the mesa since the dislocations can not interact through the mesa edge.

High quality GaInP/GaAs layers of the subject invention may be formed with low pressure metalorganic chemical vapor deposition (LP-MOCVD) as set forth above. Other forms of deposition of III–V films, may be used as well including MBE (molecular beam epitaxy), MOMBE (metalorganic molecular beam epitaxy), LPE (liquid phase epitaxy and VPE (vapor phase epitaxy).

This method is practical for any material system, and has been duplicated in the GaInP regrowth on GaAs-coated Si. It is very well-suited for epitaxy of longer-wavelength laser structures on GaAs substrates. Al-free VCSELs are one such device, as are Al-free buried ridge VCSELs, which have the active region selectively etched before epitaxy of the top DBR.

Figure 3:
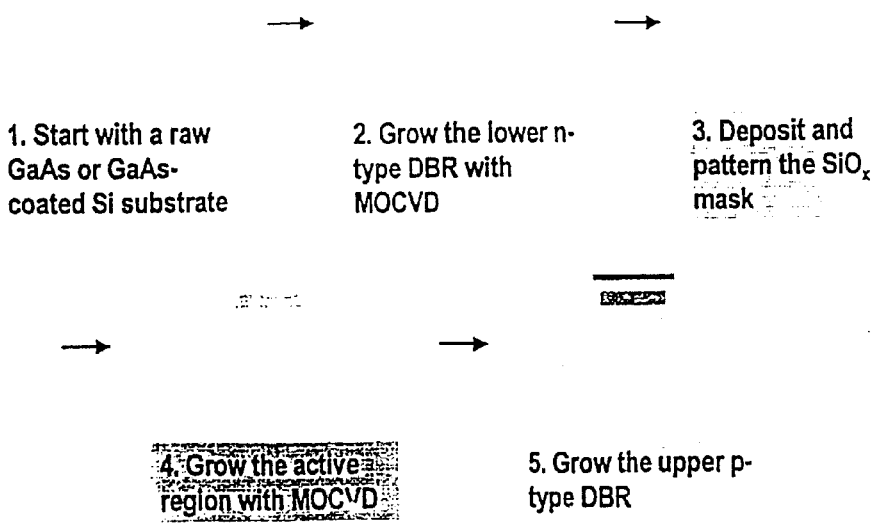
FIG. 3 is a flow chart showing a procedure for creating VCSEL structures according to the subject invention.

A further embodiment of the subject invention for creating VCSEL structures is also possible. With application of the localized epitaxy as described above, the oxide confined Al-free VCSELs may be formed by opening up windows in a $SiO_2$ layer for both definition and confinement of the active region. The outline of this technique is shown schematically in FIG. 3. Starting with a GaAs or GaAs-coated Si substrate, the lower n-type DBR is deposited with MOCVD. Next the sample is withdrawn from the reactor and a lift-off procedure is employed to open up windows in an evaporated layer of $SiO_2$. Next, the sample is re-inserted into the reactor and both the active region comprising a superlattice of InAs/GaAs and upper p-type DBR comprising 36 periods of alternating layers of GaAs (69 nm) and 76 GaInP (76 nm) are deposited.

Confining the epitaxy locally with the $SiO_2$ mask instead of a mesa has two large advantages: the oxide mask serves as a current confiner much like the native oxide in Al-containing VCSELs, plus for the growth of the p-type DBRs, it allows deposition only in the windows.

This process may be used for all Al-free material, especially the GaInP/GaAs DBRs. Further, the binary combination of GaAs/InP may be substituted for Gain in the DBR. Because these materials do not form a native oxide like those containing Al, to obtain the benefits of oxide confinement, the $SiO_2$ layer is deposited in a separate step and the optical cavity is allowed to form inside an $SiO_2$ window. Thus, it is possible to have oxide confinement of a VCSEL structure with these Al-free materials, or any material for that matter, by this technique.

The size of the windows in the $SiO_2$ layer can be varied. As discussed previously, strain can be better accommodated for growth in reduced feature sizes. This holds true for windows as well as mesas. The lateral size of the VCSEL is determined by the lateral size of its active region, which is defined by the size of the window in $SiO_2$. Therefore, it is expected that VCSELs with smaller active regions, less than 100 μm wide, will have fewer dislocations due to strain in its epilayers than those with larger active regions.

The thickness of the oxide must be thick enough to contain the entire active region, which for the case of 980 nm wavelength VCSELs is nearly 1500 Å. Since the optical cavity extends into the first couple of period of the DBR on either side, the oxide can be made thick enough to accommodate a few periods, whose thickness is 1400 Å each. Hence oxide-confined VCSELs are possible with Al-free materials.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents.

What is claimed is:

1. A method of preparing a VCSEL comprising patterning mesas in a substrate, depositing GaInP on said mesas so as to form a lattice mismatch, growing an active layer of successive layers of GaAs and InGaP; and growing a p-type layer of GaInP/GaAs as a DBR.

2. The method of claim 1, including patterning the mesas in a 16×16 μm size or a 400×400 μm size.

3. The method of claim 1, wherein the step of growing said active layer includes growing successive layers of 69 nm GaAs and 76 nm GaInP in a superlattice structure.

4. A method of preparing a VCSEL comprising the steps of:

a) preparing a layer of GaAs;

b) patterning said GaAs layer with photoresist;

c) etching said patterned photo resist to form discrete spaced mesas;

d) depositing a layer of GaInP on each of said mesas;

e) forming a superlattice of GaAs/GaInP on said GaInP layer on each of said mesas; and f) forming a p-type distributed bragg reflector on said superlattice structure.

5. The method of claim 4 wherein each of said mesas are formed to be from about 16 μm×16 μm to about 400 μm×400 μm.

6. The method of claim 4 wherein said p-type distributed bragg reflector is formed of GaInP/GaAs.

7. The method of claim 4 further including the step of doping said p-type distributed bragg reflector with a p-type dopant selected from the group consisting of Zn, Be, Cd, Mg and mixtures thereof.

* * * * *